(12) United States Patent
Hirota et al.

(10) Patent No.: US 7,489,576 B2
(45) Date of Patent: Feb. 10, 2009

(54) SEMICONDUCTOR STORAGE DEVICE

(75) Inventors: Takuya Hirota, Kanagawa (JP); Takao Yanagida, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/723,830

(22) Filed: Mar. 22, 2007

(65) Prior Publication Data

US 2007/0223297 A1    Sep. 27, 2007

(30) Foreign Application Priority Data

Mar. 24, 2006  (JP) ............................. 2006-082519

(51) Int. Cl.
*G11C 7/02* (2006.01)
(52) U.S. Cl. ................... 365/208; 365/203; 365/207
(58) Field of Classification Search ................. 365/230, 365/207, 208, 190, 63, 201
See application file for complete search history.

(56) References Cited

U.S. PATENT DOCUMENTS

| | | | | |
|---|---|---|---|---|
| 6,049,493 A | * | 4/2000 | Kitamoto et al. ............ 365/203 |
| 6,341,088 B2 | * | 1/2002 | Sakamoto et al. ........... 365/190 |
| 7,106,641 B2 | * | 9/2006 | Tsukada ...................... 365/200 |
| 2004/0145959 A1 | * | 7/2004 | Kuge et al. ............. 365/230.03 |
| 2005/0195669 A1 | * | 9/2005 | Sim ............................ 365/203 |
| 2007/0159900 A1 | * | 7/2007 | Aoki .......................... 365/203 |

FOREIGN PATENT DOCUMENTS

JP          2005-243158        9/2005

* cited by examiner

*Primary Examiner*—Gene N. Auduong
(74) *Attorney, Agent, or Firm*—Young & Thompson

(57) ABSTRACT

A semiconductor storage device has first and second cell arrays including a plurality of memory cells to store data, a sense amplifier selectively connected with either one of the first and second cell arrays, a first precharge circuit to set a pair of bit lines in the first cell array to a predetermined voltage, a second precharge circuit to set a pair of bit lines in the second cell array to a predetermined voltage, a first switch circuit to connect the sense amplifier with the first cell array, a second switch circuit to connect the sense amplifier with the second cell array, and a switch controller to control conductive state of the first and second switch circuits. In non-selection state where the sense amplifier does not access any of the cell arrays, the switch controller controls one of the switch circuits into conducting state.

16 Claims, 12 Drawing Sheets

| | SWITCH CIRCUIT 11a | SWITCH CIRCUIT 11b |
|---|---|---|
| SELECTION STATE (READING FROM MEMORY CELL 14a') | ON | OFF |
| SELECTION STATE (READING FROM MEMORY CELL 14b') | OFF | ON |
| NON-SELECTION STATE*1 NO CROSS-FAIL | ON (or OFF) | OFF (or ON) |
| NON-SELECTION STATE CROSS-FAIL IN MEMORY CELL 14a' | OFF | ON |
| NON-SELECTION STATE CROSS-FAIL IN MEMORY CELL 14b' | ON | OFF |

*1 BOTH SWITCH CIRCUITS 11a AND 11b MAY BE ON

Fig. 8

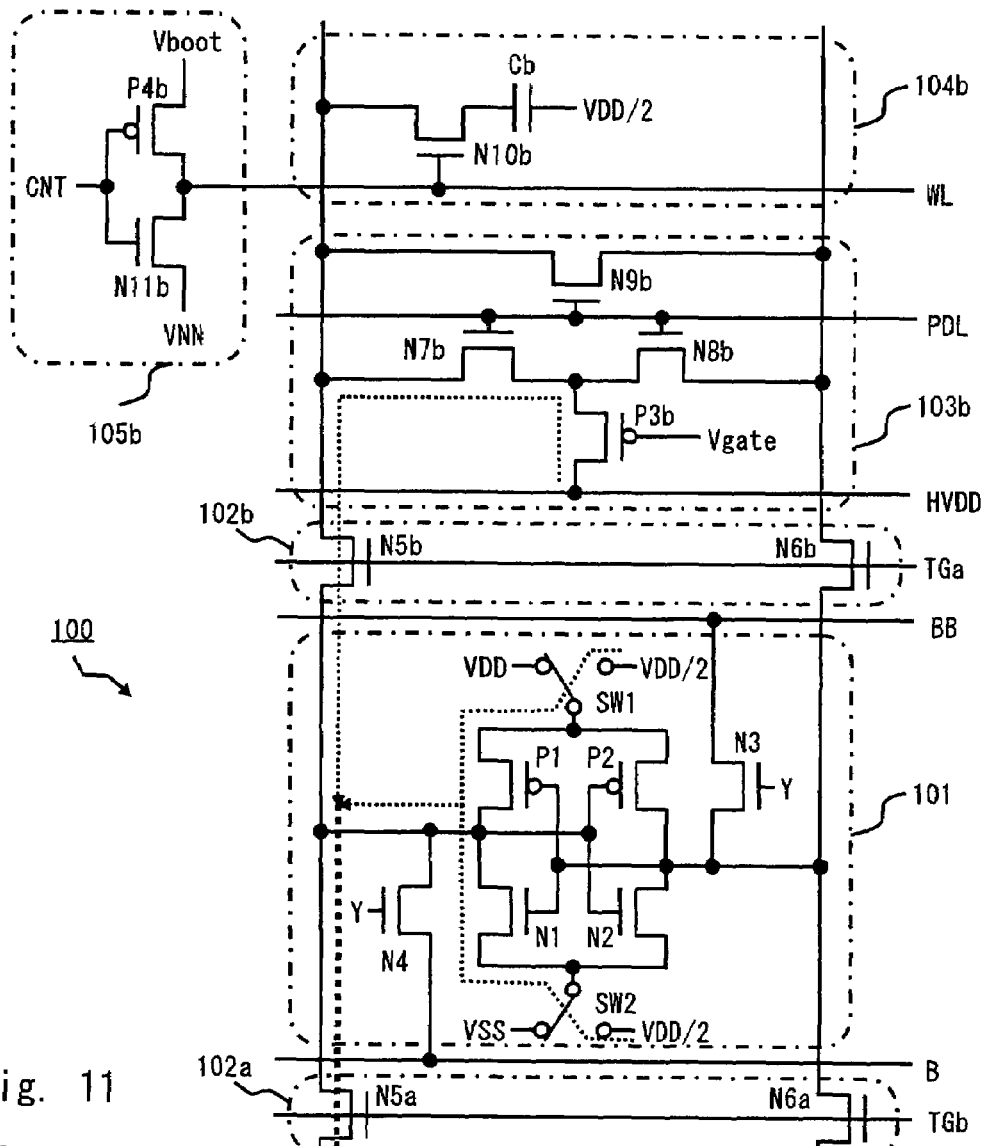
Fig. 11
RELATED ART
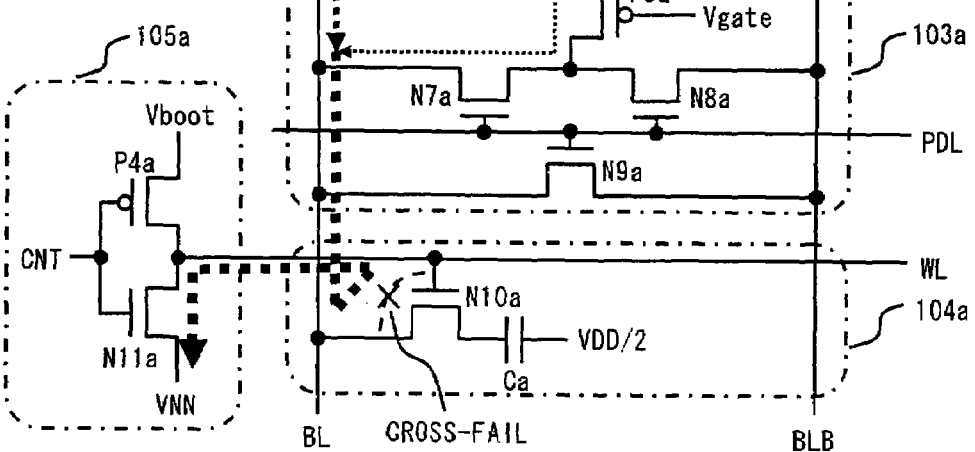

RELATED ART

| | SWITCH CIRCUIT 102a | SWITCH CIRCUIT 102b |
|---|---|---|
| SELECTION STATE (READING FROM MEMORY CELL 14a') | ON | OFF |
| SELECTION STATE (READING FROM MEMORY CELL 14b') | OFF | ON |
| NON-SELECTION STATE | ON | ON |

Fig. 12

SEMICONDUCTOR STORAGE DEVICE

BACKGROUND OF THE INVENTION

1. Field of the Invention

The present invention relates to semiconductor devices and particularly to a semiconductor device including a shared sense amplifier.

2. Description of Related Art

Various semiconductor storage devices (which are referred to hereinafter as memories) are used in portable devices. Semiconductor devices used for portable devices need to operate with low power consumption so as to sustain a longer battery life of the portable device. Memories used for portable devices also need to operate with low power consumption. Further, there are increasing demands for large capacity and high-speed operation on memories, and the manufacturing process of memories is shifted to finer design rules to meet such demands. Furthermore, in order to provide larger capacity and higher-speed operation in circuits, a shared sense amplifier and a precharge circuit are used in a volatile memory such as a DRAM (Dynamic Random Access Memory).

A shared sense amplifier is used to provide larger capacity. In a DRAM, a shared sense amplifier is used for a cell array in which a plurality of memory cells are arranged in matrix to thereby reduce the number of sense amplifiers compared with a case where one sense amplifier is used for one cell array. With the shared sense amplifier, it is possible to read the data stored in a plurality of cell arrays using one sense amplifier. A switch circuit is disposed between the shared sense amplifier and each memory cell on the cell array with which the shared sense amplifier is connected, so that the shared sense amplifier can read the data of each memory cell one by one by controlling the switch circuit.

The precharge circuit is used to provide high-speed data processing. In a DRAM, the data of one memory cell is read using a pair of bit lines operating differentially with reference to a predetermined voltage to thereby detect a slight change in the bit line voltage and achieve high-speed data reading. Because the pair of bit lines operate in reference to a predetermined voltage, the two bit lines need to have the same voltage. To this end, such a memory typically includes a precharge circuit between a pair of bit lines. The precharge circuit operates when a memory is in the stand-by or non-selection state to supply a given voltage to each of the pair of bit lines so as to equalize their voltages.

However, as memories are manufactured according to finer design rules, the problem that element defect occurring during the manufacturing process causes an increase in leakage becomes significant. Particularly, if cross-fail occurs in a DRAM, leakage current increases to hinder the reduction of current in a memory cell in the non-selection state. The cross-fail is such that the drain and gate of a gate transistor of a memory cell are short-circuited with resistance. The cross-fail is difficult to detect in a shipping test because the drain and gate of a gate transistor are short-circuited with resistance and thus it functions as a transistor. A technique to reduce the current of a memory cell in the non-selection state when cross-fail occurs in a memory using a shared sense amplifier is disclosed in Japanese Unexamined Patent Publication No. 2005-243158.

FIG. 11 is a circuit diagram of a memory 100 of the related art disclosed in Japanese Unexamined Patent Publication No. 2005-243158. As shown in FIG. 11, the memory 100 of the related art includes a shared sense amplifier 101, switch circuits 102a and 102b, precharge circuits 103a and 103b, memory cells 104a and 104b, and word drivers 105a and 105b. In the memory 100 in the non-selection state, the switch circuits 102a and 102b are set to the conducting state (ON state), the bit lines BL and BLB are set to a precharge voltage HVDD (e.g. VDD/2) by the precharge circuits 103a and 103b, and the power supply voltage and the ground voltage of the shared sense amplifier are set to a non-selection voltage VDD/2. Further, a charge retention voltage VNN is supplied from the word drivers 105a and 105b to the gates of gate transistors N10a and N10b of the memory cells 104a and 104b, so that the gate transistors N10a and N10b are in the blocked state.

On the other hand, when reading the data stored in the memory cell 104a in the selection state, the switch circuit 102a is set to the ON state and the switch circuit 102b is set to the blocked state (OFF state) to thereby stop the operation of the precharge circuit 103a. Further, the power supply voltage and the ground voltage of the shared sense amplifier 101 are respectively set to a power supply voltage VDD and a ground voltage VSS. After that, a boosted voltage Vboot is supplied from the word driver 105a to the gate of the gate transistor N10a of the memory cell 104a. The charge of the bit line BL thereby changes according to the charge accumulated in a capacitor Ca. On the other hand, the charge of the bit line BLB does not change because nothing is connected with the bit line BLB. The shared sense amplifier amplifies a difference in charge between the bit line BL and the bit line BLB to thereby read the data stored in the memory cell 104a.

When reading the data stored in the memory cell 104b in the selection state, the switch circuit 102a is set to the OFF state and the switch circuit 102b is set to the ON state to thereby stop the operation of the precharge circuit 103b. Further, the power supply voltage and the ground voltage of the shared sense amplifier 101 are respectively set to the power supply voltage VDD and the ground voltage VSS. After that, a boosted voltage Vboot is supplied from the word driver 105b to the gate of the gate transistor N10b of the memory cell 104b. The charge of the bit line BL thereby changes according to the charge accumulated in a capacitor Cb. On the other hand, the charge of the bit line BLB does not change because nothing is connected to the bit line BLB. The shared sense amplifier amplifies a difference in charge between the bit line BL and the bit line BLB to thereby read the data stored in the memory cell 104b. FIG. 12 collectively shows the conductive states of the switch circuits in these operations.

A case where cross-fail occurs in the memory 100 of the related art is described hereinafter. The following description is given on a case where cross-fail occurs in the gate transistor N10a of the memory cell 104a for example.

If cross-fail occurs in the gate transistor N10a, the drain and gate of the gate transistor are short-circuited with resistance. The bit line BL and the word line WL are thereby connected through resistance. As a result, leakage current flows according to a voltage difference between the precharge voltage HVDD and the charge retention voltage VNN. There are three paths for leakage current: a path from the precharge voltage HVDD of the precharge circuit 103a through transistors P3a and N7a to the bit line BL, a path from the non-selection voltage VDD/2 of the shared sense amplifier 101 through transistors P1 and N1 to the bit line BL, and a path from the precharge voltage HVDD of the precharge circuit 103b through transistors P3b and N7b to the bit line BL.

The memory 100 reduces the leakage current flowing through the precharge circuit by disposing a current limiter in the precharge circuit. The current limiters used in the memory 100 of FIG. 11 are the transistor P3a of the precharge circuit 103a and the transistor P3b of the precharge circuit 103b. The transistors P3a and P3b receive a constant voltage Vgate at their gates so as to have high resistance in the conducting state. The memory 100 of the related art can thereby reduce the leakage current by the transistors P3a and P3b.

However, in the memory 100 of the related art, a current limiter is not placed between the shared sense amplifier 101 and the power supply. Accordingly, the leakage current flowing from the shared sense amplifier 101 upon occurrence of cross-fail is higher than the leakage current flowing from the precharge circuit. Further, because the shared sense amplifier 101 has large current consumption during the operation, the placement of a current limiter between the shared sense amplifier 101 and the power supply increases the power supply voltage drop to cause unstable operation.

Further, recent large capacity memories have a numerous number of memory cells and accordingly the number of places where cross-fail occur increases. In addition, the uses of a finer design rules for the manufacture of memories further increases the probability of the occurrence of cross-fails. Therefore, the leakage current of a chip as a whole cannot be reduced sufficiently merely with the use of a current limiter in a precharge circuit.

SUMMARY OF THE INVENTION

According to one aspect of the present invention, there is provided a semiconductor storage device including a first and a second cell arrays including a plurality of memory cells to store data, a sense amplifier selectively connected with either one of the first and the second cell arrays, a first precharge circuit to set a pair of bit lines in the first cell array to a predetermined voltage, a second precharge circuit to set a pair of bit lines in the second cell array to a predetermined voltage, a first switch circuit to connect the sense amplifier with the first cell array, a second switch circuit to connect the sense amplifier with the second cell array, and a switch controller to control conductive state of the first and the second switch circuits, wherein in non-selection state where the sense amplifier does not access any of the first and the second cell arrays, the switch controller controls one of the first and the second switch circuits into conducting state according to a result of current inspection in standby state performed in advance.

According to another aspect of the present invention, there is provided a test method of a semiconductor storage device including a first switch circuit to connect a sense amplifier with a first cell array, a second switch circuit to connect the sense amplifier with a second cell array, a non-selection state storage section to store state of the first and the second switch circuits in non selection state where the sense amplifier does not access any of the first and the second cell arrays, the method including measuring first standby current by setting the first switch circuit into conducting state and the second switch circuit into non-conducting state, measuring second standby current by setting the first switch circuit into non-conducting state and the second switch circuit into conducting state, and storing switch circuit state where a smaller current amount of the first standby current or the second standby current is obtained into the non-selection state storage section.

The semiconductor storage device controls either one of the first and the second switch circuits into conducting state in the non-selection state according to a result of current inspection in standby state which is performed in advance. If leakage current increases due to cross-fail in the first cell array, for example, the device turns OFF the first switch circuit in the non-selection state to thereby block the leakage current flowing from the second precharge circuit and the sense amplifier. As a result, the leakage current due to the cross-fail occurring in the memory cell during the non-selection state flows only from the first precharge circuit in the semiconductor storage device of the present invention. Consequently, the semiconductor storage device of the present invention enables significant reduction of leakage current compared with the semiconductor storage device of the related art.

Further, because the second switch circuit is ON even if the first switch circuit is OFF in the non-selection state, a pair of bit lines connected with the sense amplifier have a predetermined voltage because of the second precharge circuit. Therefore, even after the state shifts from the non-selection state to the selection state, no operation delay occurs because the voltages of the bit lines are kept to the predetermined voltage. Specifically, the operation speed does not become lower when the first switch circuit is turned OFF in order to reduce the leakage current due to cross-fail.

BRIEF DESCRIPTION OF THE DRAWINGS

The above and other objects, advantages and features of the present invention will be more apparent from the following description taken in conjunction with the accompanying drawings, in which:

FIG. 8 is a view showing the states of a switch circuit of a DRAM according to an embodiment of the present invention;

FIG. 11 is a circuit diagram of a DRAM according to a related art; and

FIG. 12 is a view showing the states of a switch circuit of a DRAM according to a related art.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
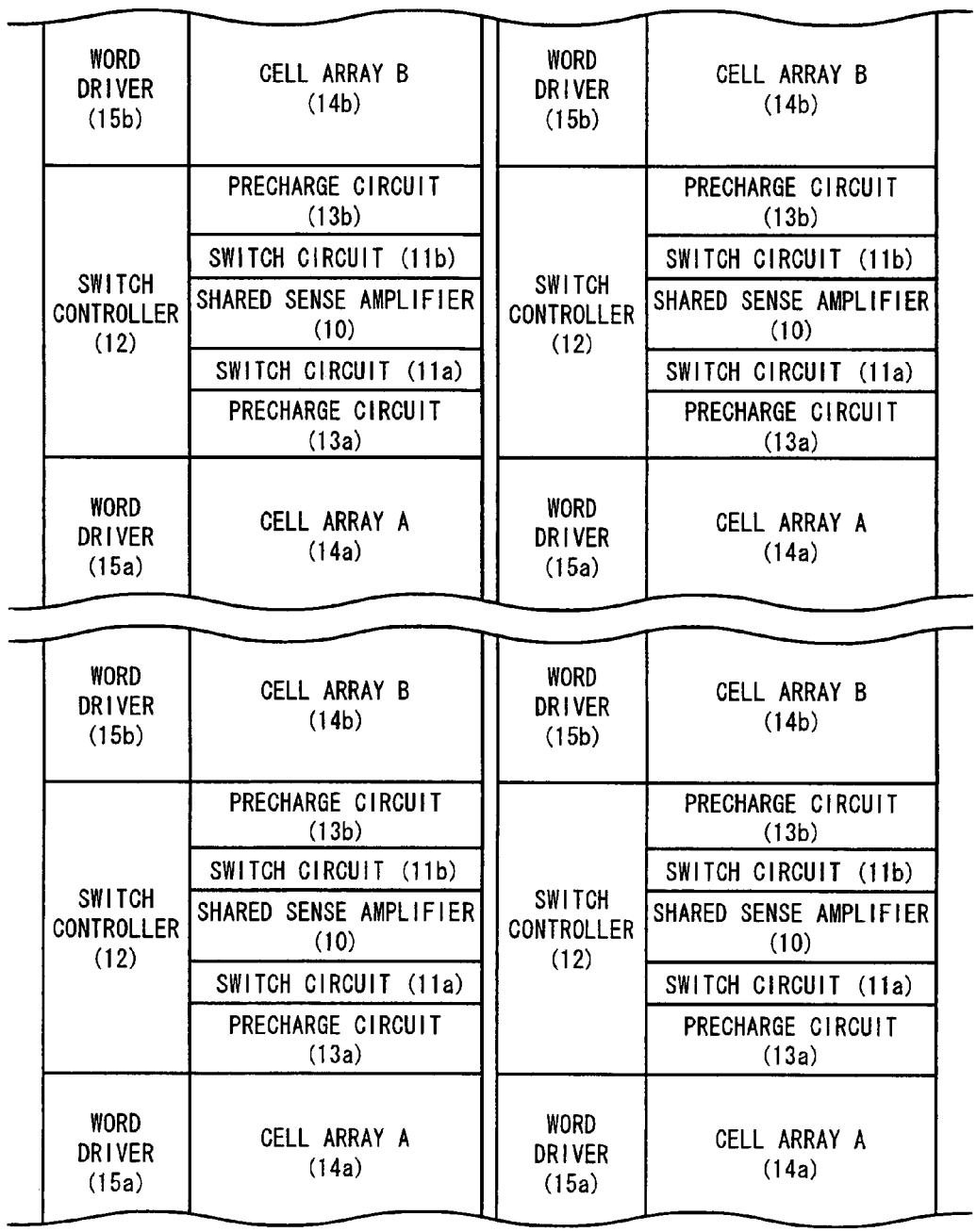
FIG. 1 is a top view of the layout of a DRAM according to an embodiment of the present invention.

An embodiment of the present invention is described hereinafter with reference to the drawings. A semiconductor storage device 1 according to this embodiment may be a DRAM (Dynamic Random Access Memory) which stores data in memory cells. FIG. 1 is a schematic diagram of the plan layout of a DRAM 1 of this embodiment.

As shown in FIG. 1 the DRAM 1 includes a shared sense amplifier 10, a first and a second switch circuit, (e.g. switch circuits 11a and 11b), a switch controller 12, a first and a second precharge circuits (e.g. precharge circuits 13a and 13b), a first and a second cell arrays (e.g. cell arrays 14a and 14b), and word drivers 15a and 15b. These blocks constitute a set of functional group, and the DRAM 1 includes a plurality of functional groups arranged in matrix.

The cell arrays 14a and 14b are integrated together in the plan layout. In this embodiment, a cell array area including a memory cell connected with the switch circuit 11a is referred to as the cell array 14a, and a cell array area including a memory cell connected with the switch circuit 11b is referred to as the cell array 14b. The word drivers 15a and 15b are also integrated together in the plan layout. A word driver connected with the cell array 14a is referred to as the word driver 15a, and a word driver connected with the cell array 14b is referred to as the word driver 15b.

The arrangement of the blocks in a functional group is described hereinafter. The shared sense amplifier 10 is placed between the cell array 14a and the cell array 14b. Between the shared sense amplifier 10 and the cell array 14a are placed the switch circuit 11a and the precharge circuit 13a. The switch circuit 11a is adjacent to the shared sense amplifier 10, and the precharge circuit 13a is adjacent to the cell array 14a. On the other hand, between the shared sense amplifier 10 and the cell array 14b are placed the switch circuit 11b and the precharge circuit 13b. The switch circuit 11b is adjacent to the shared sense amplifier 10, and the precharge circuit 13b is adjacent to the cell array 14b.

The switch controller 12 is placed adjacent to the precharge circuits 13a and 13b, the switch circuits 11a and 11b, and the shared sense amplifier 10. The word driver 15a is placed adjacent to the switch controller 12 and the cell array 14a. The word driver 15b is placed adjacent to the switch controller 12 and the cell array 14b.

Figure 2:
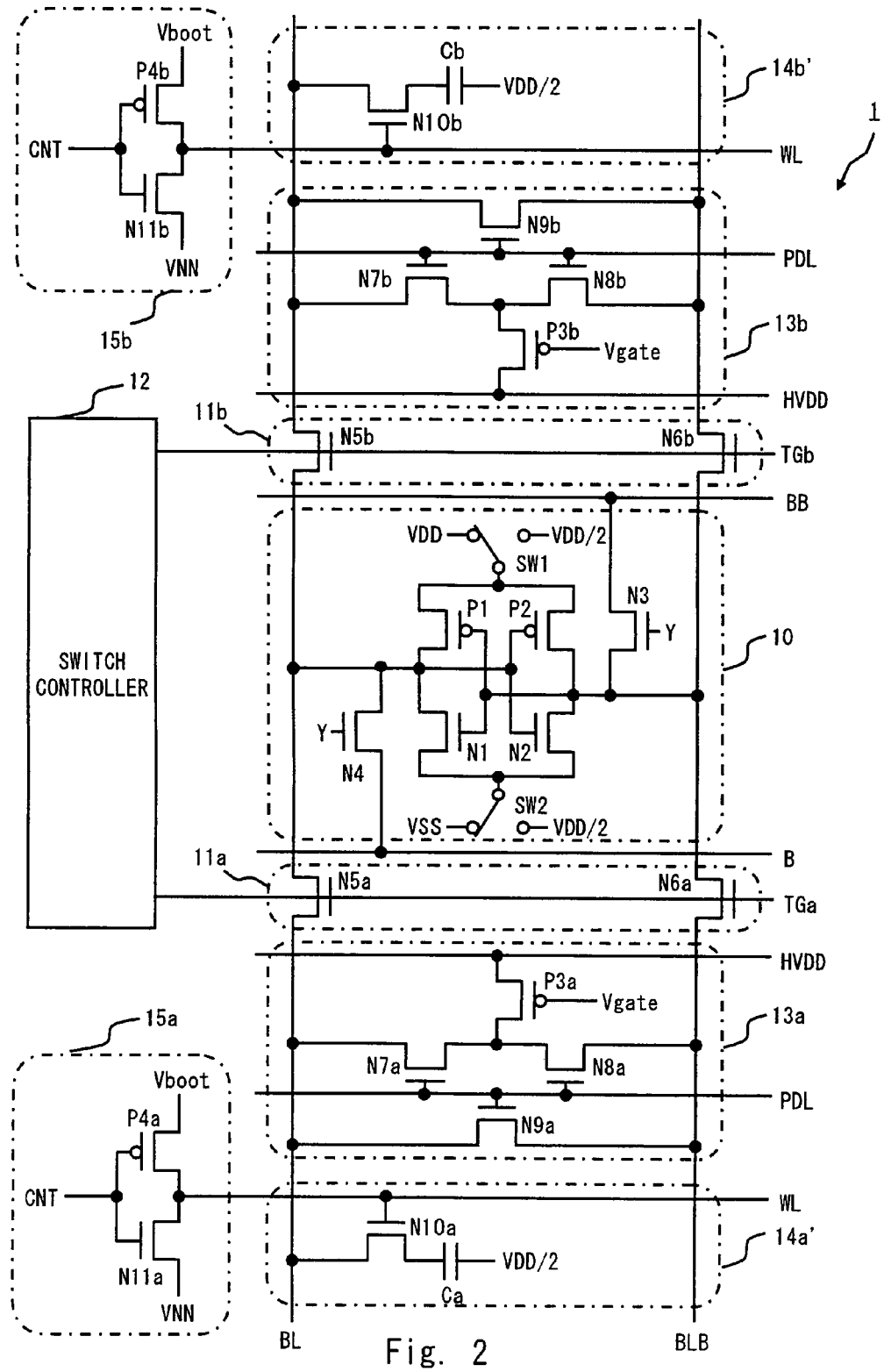
FIG. 2 is a circuit diagram of a DRAM according to an embodiment of the present invention.

The functional group of the DRAM 1 is described hereinafter in further detail. The DRAM 1 is composed of a plurality of circuits as the functional groups having the same configuration. FIG. 2 shows one circuit among them as an example. Although the cell arrays 14a and 14b in FIG. 1 include a plurality of memory cells, one of the memory cells in each of the cell arrays 14a and 14b is illustrated in FIG. 2 for simplification.

As shown in FIG. 2, the DRAM 1 includes the shared sense amplifier 10, the first and the second switch circuits, (e.g. the switch circuits 11a and 11b), the switch controller 12, the first and the second precharge circuits (e.g. the precharge circuits 13a and 13b), a first and a second memory cells (e.g. memory cells 14a' and 14b'), and the word drivers 15a and 15b.

The shared sense amplifier 10 is selectively connected with either one of the memory cell 14a' in the cell array 14a and the memory cell 14b' in the cell array 14b and reads the data stored in the selectively connected memory cell. The data is read by amplifying a differential voltage transmitted through a pair of a first bit line connected with the memory cells 14a' and 14b' (e.g. a bit line BL) and a second bit line not connected with the memory cells 14a' and 14b' (e.g. a bit line BLB).

In a sense amplifier section of the shared sense amplifier 10, two inverters are connected with each other in such a way that an output of a first inverter is connected with an input of a second inverter and an output of the second inverter is connected with an input of the first inverter. Further, the input of the first inverter is connected with the bit line BL, and the input of the second inverter is connected with the bit line BLB. The sense amplifier section of the shared sense amplifier 10 amplifies a voltage difference which occurs between the bit line BL and the bit line BLB.

The sense amplifier outputs one output to an output line B through a transistor N4 connected between the bit line BL and the output line B. It outputs another output that serves as a differential voltage through a transistor N3 connected between the bit line BLB and the output line BB. A column control signal Y output from a column decoder (not shown) is supplied to the gates of the transistors N3 and N4. The sense amplifier performs the read operation according to the column control signal Y.

The bit lines BL and BLB which are connected with the shared sense amplifier 10 are connected with the bit lines BL and BLB of the memory cell 14a' through the switch circuit 11a and also connected with the bit lines BL and BLB of the memory cell 14b' through the switch circuit 11b.

The switch circuits 11a and 11b operate according to switch control signals TGa and TGb, respectively, output from the switch controller 12. The switch control signals TGa and TGb bring either one of the switch circuits 11a and 11b into conduction according to address information transmitted from outside in the selection state where the shared sense amplifier 10 reads data of the memory cell 14a' or 14b'. On the other hand, the switch control signals TGa and TGb bring at least one of the switch circuits 11a and 11b into conduction according to the state stored in a non-selection state storage section in the switch controller 12 in the non-selection state where the shared sense amplifier 10 does not access any of the memory cells 14a' and 14b'. The switch controller 12 is described in further detail later.

The switch circuit 11a includes transistors N5a and N6a. The transistor N5a serves as a switch to connect the bit line BL connected with the shared sense amplifier 10 and the bit line BL of the memory cell 14a'. The transistor N6a serves as a switch to connect the bit line BLB connected with the shared sense amplifier 10 and the bit line BLB of the memory cell 14a'.

The switch circuit 11b includes transistors N5b and N6b. The transistor N5b serves as a switch to connect the bit line BL connected with the shared sense amplifier 10 and the bit line BL of the memory cell 14b'. The transistor N6b serves as a switch to connect the bit line BLB connected with the shared sense amplifier 10 and the bit line BLB of the memory cell 14b'.

The precharge circuits 13a and 13b are placed between the switch circuit 11a and the memory cell 14a' and between the switch circuit 11b and the memory cell 14b', respectively. The precharge circuits 13a and 13b are connected between the bit line BL and the bit line BLB. The precharge circuits 13a and 13b have the same configuration, and the precharge circuit 13a is described hereinafter as an example.

The precharge circuit 13a includes transistors N7a to N9a and P3a. The gates of the transistors N7a to N9a are connected with a precharge control line PDL. The source and drain of the transistor N9a are connected with the bit lines BL and BLB, respectively. The transistors N7a and N8a are connected in series between the bit lines BL and BLB, and the drain of the transistor P3a is connected with a node between the transistors N7a and N8a. The source of the transistor P3a is connected with a first power supply (e.g. a precharge voltage HVDD at VDD/2). The gate of the transistor P3a is connected with a constant voltage Vgate. The transistor P3a functions as a current limiter and serves as a resistor having predetermined resistance according to the value of the constant voltage Vgate.

The memory cells 14a' and 14b' have the same configuration, and the memory cell 14a' is described hereinafter as an example. The memory cell 14a' includes a transistor N10a and a capacitor Ca. The transistor N10a serves as a gate transistor. The drain of the transistor N10a is connected with the bit line BL. The source of the transistor N10a is connected with a reference voltage VDD/2 through the capacitor Ca. The gate of the transistor N10a is connected with a corresponding word line WL.

The word drivers 15a and 15b have the same configuration, and the word driver 15a is described hereinafter as an example. The gate driver 15a includes transistors N11a and P4a. The transistors N11a and P4a are connected between a boosted voltage Vboot and a charge retention voltage VNN. A row control signal CNT is input from a row decoder (not shown) to the gates of the transistors N11a and P4a. The word line WL is connected with a node between the transistors N11a and P4a. The word driver 15a outputs either one of the boosted voltage Vboot and the charge retention voltage VNN to the word line WL according to the row control signal CNT.

When the boosted voltage Vboot is supplied to the word line WL, the memory cell 14a' brings the transistor N10a into the conducting state to thereby connect the capacitor Ca with the bit line BL. On the other hand, when the charge retention voltage VNN is supplied to the word line WL, the memory cell 14a' brings the transistor N10a into the blocked state to thereby maintain the charge stored in the capacitor Ca.

The switch controller 12 is described hereinafter in detail. The switch controller 12 outputs the switch control signals TGa and TGb to control the switch circuits 11a and 11b, respectively. When, in the selection state, the shared sense amplifier 10 reads the data of the memory cell 14a', the switch control signal TGa is at High level (e.g. the boosted voltage Vboot), and the switch control signal TGb is at Low level (e.g. the ground voltage VSS). On the other hand, when, in the selection state, the shared sense amplifier 10 reads the data of the memory cell 14b', the switch control signal TGa is at Low level, and the switch control signal TGb is at High level. The shared sense amplifier 10 is thereby selectively connected with the memory cell storing the data to be read.

In the non-selection state, the states of the switch control signals TGa and TGb are set by the non-selection state storage section in the switch controller 12. For example, if cross-fail occurs in one of the memory cells connected with the shared sense amplifier, the non-selection state storage section sets the switch circuit on the side of the memory cell having the cross-fail to the OFF state by turning the switch control signal to Low level. If no cross-fail occurs in any of the memory cells, the non-selection state storage section sets either one of the switch circuits to be connected with the shared sense amplifier 10 to the ON state by turning the switch control signal to High level. Alternatively, if cross-fail does not occur in any of the memory cells, both of the switch circuits may be set to the ON state.

Figure 3A:
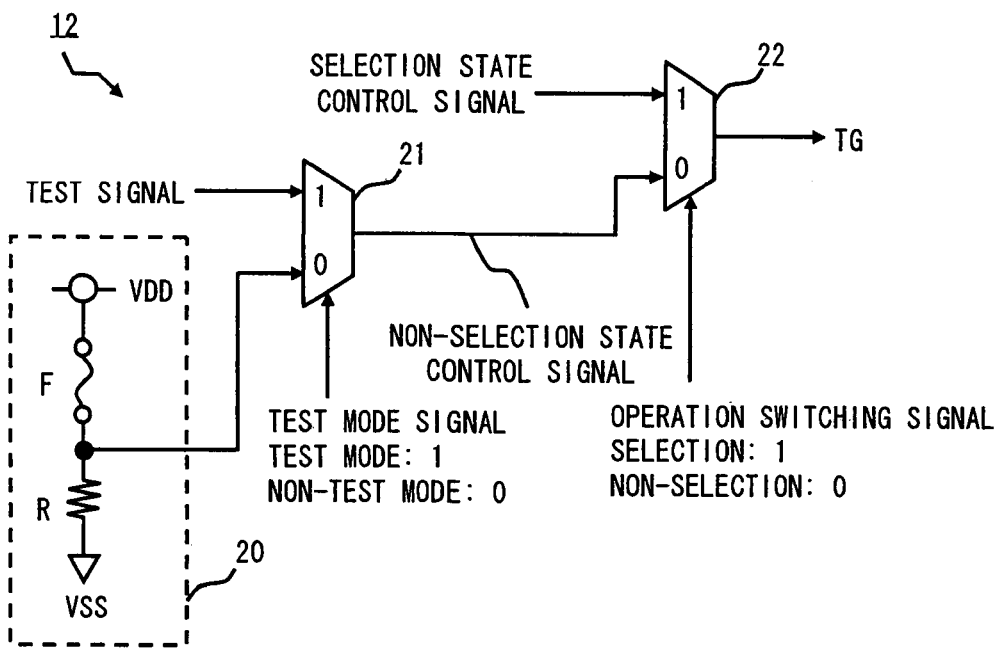
FIGS. 3A and 3B are circuit diagrams of switch controllers according to an embodiment of the present invention.
Figure 3B:
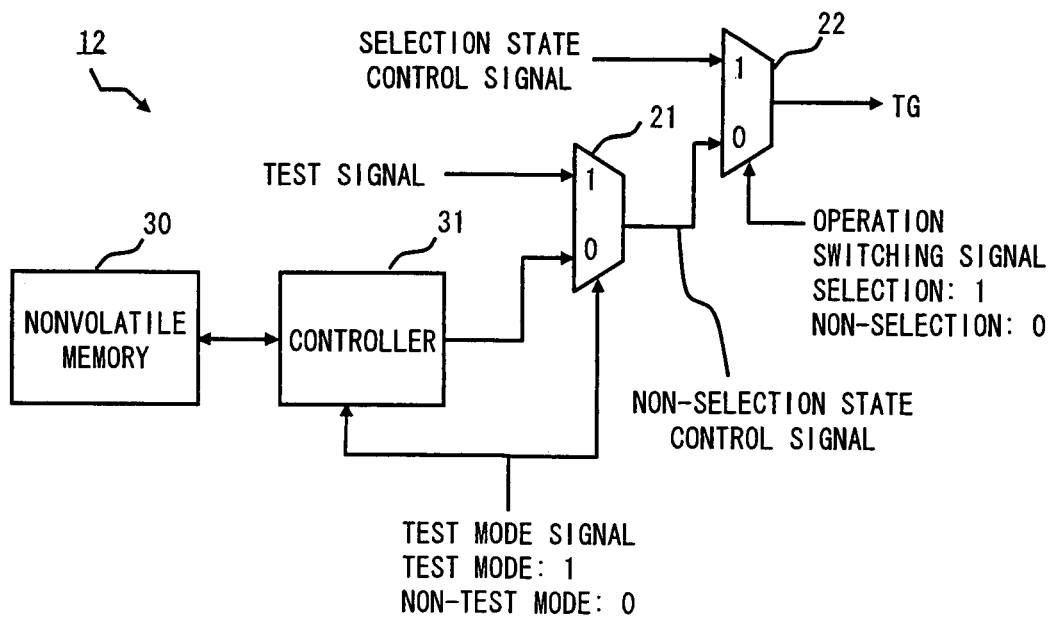

FIG. 3A shows an example of an internal circuit of the switch controller 12, and FIG. 3B shows another example of an internal circuit of the switch controller 12. The internal circuit of the switch controller 12 is described hereinafter with reference to FIGS. 3A and 3B. The switch controller 12 includes a plurality of outputs to control a plurality of switch circuits, and a circuit to provide one output is described hereinbelow. The example of FIG. 3A uses a fuse as a non-selection state storage section.

The switch controller 12 of FIG. 3A includes a non-selection state storage section 20 and selectors 21 and 22. The non-selection state storage section 20 includes a fuse F and a resistor R. The fuse F and the resistor R are connected in series between the power supply voltage VDD and the ground voltage VSS. A node between the fuse F and the resistor R is connected with an input "0" of the selector 21. A test signal is input to an input "1" of the selector 21. The selector 21 outputs either one of the two inputs according to a test mode signal. An output of the selector 21 (e.g. a non-selection state control signal) is input to an input "0" of the selector 22, and a selection state control signal is input to an input "1" of the selector 22. The selector 22 outputs either one of the two inputs according to an operation switching signal.

The test signal may be a signal to be used for shipping inspection. The test mode signal may be "1" in the test mode for shipping inspection and "0" in the use state. (non-test mode) after shipping, for example. The selection state control signal may be a signal to control the states of the switch circuits 11a and 11b in the operation state to make an access to the memory cell. The operation switching signal indicates whether the memory cell is in the selection state or in the non-selection state, and it may be "1" in the selection state and "0" in the non-selection state.

The switch controller 12 of FIG. 3A outputs the selection state control signal as a switch control signal TG in the selection state. In the non-selection state, on the other hand, the switch controller 12 outputs the switch control signal TG based on the test signal during the shipping inspection and outputs the switch control signal TG based on the value of the non-selection state storage section 20 during the non-test mode. The non-selection state storage section 20 outputs a Low level when the fuse F is cut and outputs a High level when the fuse F is not cut.

The switch controller 12 of FIG. 3B is described hereinafter. The switch controller 12 of FIG. 3B uses the same selectors 21 and 22 as those in the switch controller 12 of FIG. 3A. In the switch controller 12 of FIG. 3B, an output of a controller 31 is input to the input "0" of the selector 21. Further, the switch controller 12 of FIG. 3B uses a nonvolatile memory 30 as a non-selection state storage section. The nonvolatile memory 30 stores the state of the switch circuit in the non-selection state. The stored switch state is written according to the test result in the test mode. The controller 31 writes the state of the switch circuit into the nonvolatile memory 30 in the test mode, and reads and outputs the switch state stored in the nonvolatile memory 30 in the non-test mode. Thus, the switch controller of FIG. 3B operates in the same manner as the switch controller of FIG. 3A.

The process flow to set the switch state to be stored in the non-selection state storage section is described hereinafter. The switch state to be stored in the non-selection state storage section is determined according to the result of current inspection in the standby state which is carried out in advance. The current inspection in the standby state measures the amount of leakage current in the standby state and determines a DRAM to be non-defective if the leakage current in the standby state is smaller than a predetermined value (e.g. a specification value), for example. The standby state is a state where all memory cells are in the non-selection state. In this embodiment, the standby state is a state where either one of switch circuits is in the conducting state.

Figure 4:
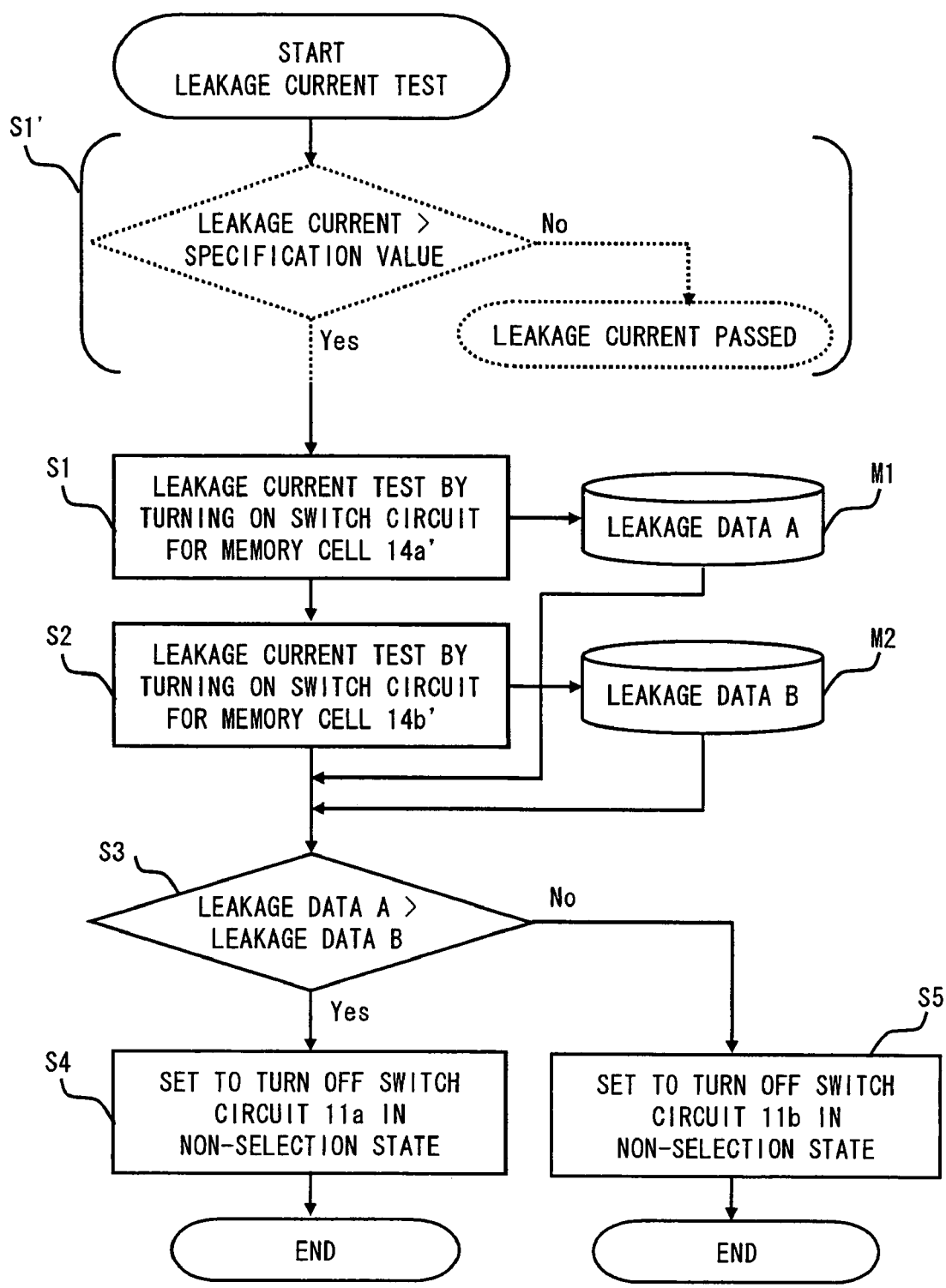
FIG. 4 is a flowchart to set a switch state to be stored in a non-selection state storage section according to an embodiment of the present invention.

FIG. 4 shows a flowchart to set the switch state to be stored in the non-selection state storage section. Upon start of a leakage current test, first standby current (e.g. first leakage current) is measured by setting only the switch circuit 11a on the side of the memory cell 14a' to the ON state (Step S1). The current value of the first leakage current measured in Step S1 is stored as leakage data A into a storage section M. Further, second standby current (e.g. second leakage current) is measured by setting only the switch circuit 11b on the side of the memory cell 14b' to the ON state (Step S2). The current value of the second leakage current measured in Step S2 is stored as leakage data B into a storage section M2.

After that, the leakage data A and the leakage data B are compared with each other (Step S3). If the comparison result in Step S3 shows that the leakage data A is larger (Yes in S3), it indicates that cross-fail occurs in the memory cell 14a', and therefore the setting to turn OFF the switch circuit 11a in the non-selection state is stored in the non-selection state storage section of the switch controller 12 (Step S4). On the other hand, if the comparison result in Step S3 shows that the leakage data B is larger (No in S3), it indicates that cross-fail occurs in the memory cell 14b', and therefore the setting to turn OFF the switch circuit 11b in the non-selection state is stored in the non-selection state storage section of the switch controller 12 (Step S5).

As described in the foregoing, it is possible to set the states of the switch circuits 11a and 11b in the non-selection state by using the result of the current inspection in the standby state which is carried out in advance. Further, because the non-selection state storage section stores the state using the fuse F or the nonvolatile memory 30, the setting is not lost after the shipping.

In the flowchart of FIG. 4, it is possible to add a step (Step S1') to measure third standby current by setting all switch circuits to the conducting state before Step S1. If the third standby current satisfies a specification value, it is possible to set such that all switch circuits in the non-selection state are set to the conducting state without performing Steps S1 to S5. Further, if, as a result of Step S1', the third standby current mostly satisfies a specification value, it is possible to reduce the testing time.

Figure 5A:
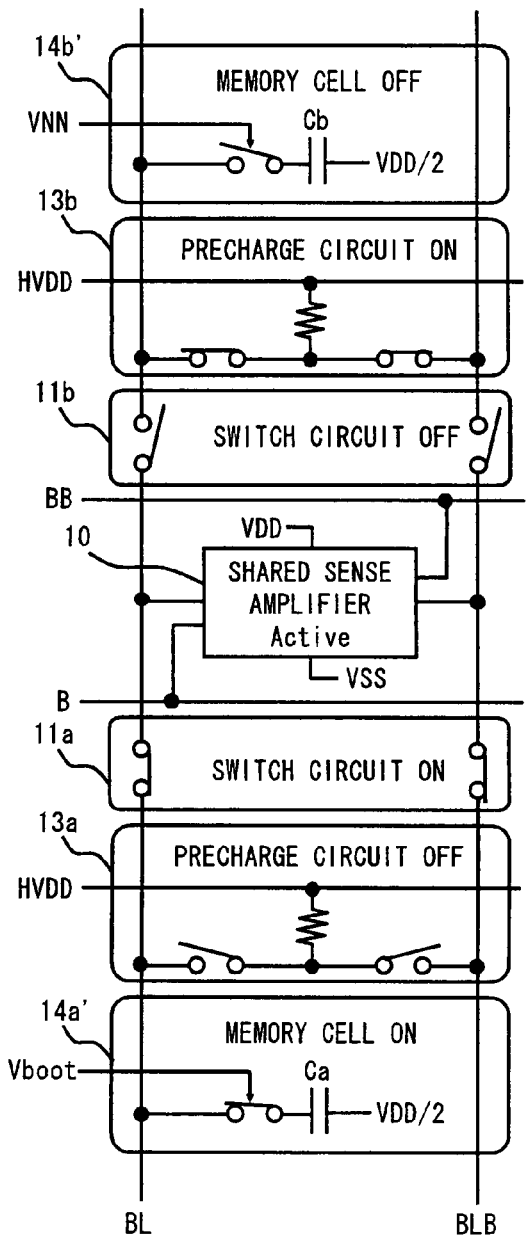
FIGS. 5A and 5B are schematic diagrams of a DRAM in the selection state according to an embodiment of the present invention.
Figure 5B:
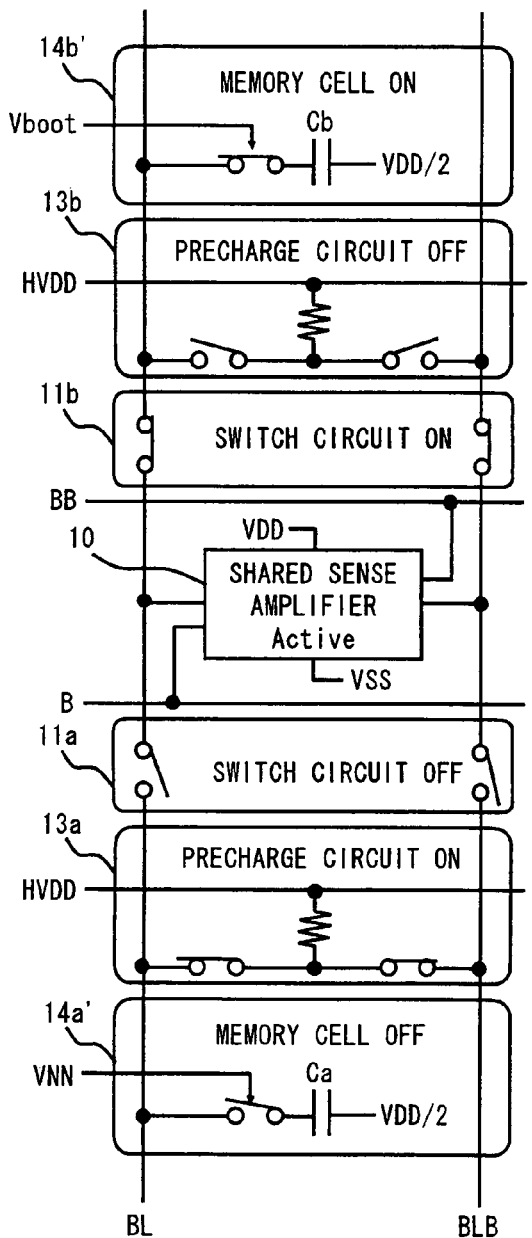

The operation of the DRAM 1 is described hereinafter with reference to the schematic diagrams of FIGS. 5A to 7. FIGS. 5A and 5B show the operation of the DRAM 1 in the selection state. FIG. 5A is a schematic diagram showing the case of reading the data stored in the memory cell 14a'. As shown in FIG. 5A, the switch circuit 11a is ON and the switch circuit 11b is OFF in this case. The shared sense amplifier 10 operates according to the power supply voltage VDD and the ground voltage VSS. The shared sense amplifier 10 and the memory cell 14a' are thereby conductive, so that the shared sense amplifier 10 reads the data of the memory cell 14a'. The precharge circuit 13a is in the OFF state, so that the precharge voltage HVDD is not supplied to the bit lines BL and BLB on the side of the memory cell 14a'. On the other hand, precharge circuit 13b is in the ON state, so that the precharge voltage HVDD is supplied to the bit lines BL and BLB on the side of the memory cell 14b'.

FIG. 5B is a schematic diagram showing the case of reading the data stored in the memory cell 14b'. As shown in FIG. 5B, the switch circuit 11a is OFF and the switch circuit 11b is ON in this case. The shared sense amplifier 10 operates according to the power supply voltage VDD and the ground voltage VSS. The shared sense amplifier 10 and the memory cell 14b' are thereby conductive, so that the shared sense amplifier 10 reads the data of the memory cell 14b'. The precharge circuit 13a is in the ON state, so that the precharge voltage HVDD is supplied to the bit lines BL and BLB on the side of the memory cell 14a'. On the other hand, precharge circuit 13b is in the OFF state, so that the precharge voltage HVDD is not supplied to the bit lines BL and BLB on the side of the memory cell 14b'.

Figure 6:
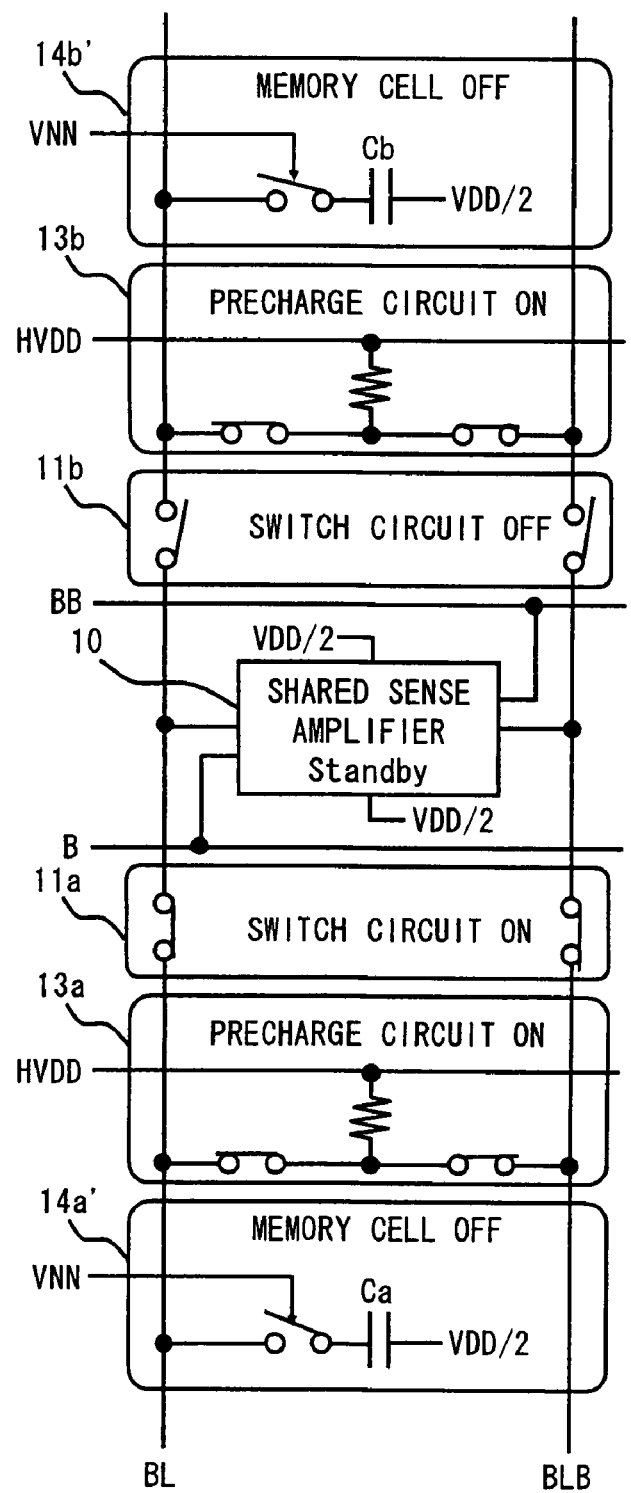
FIG. 6 is a schematic diagram of a DRAM in the non-selection state where cross-fail does not occur according to an embodiment of the present invention.

FIG. 6 is a schematic diagram showing the case where no cross-fail occurs in any of the memory cells 14a' and 14b' in the non-selection state and the leakage current satisfies a specification value. In the example of FIG. 6, the switch circuit 11a is ON and the switch circuit 11b is OFF. The shared sense amplifier 10 receives VDD/2 at the power supply voltage and the ground voltage. The shared sense amplifier 10 is thereby in the non-selection state. The precharge circuits 13a and 13b are both in the ON state, so that the precharge voltage HVDD is supplied to the bit lines BL and BLB. Because the switch circuit 11a is ON, the precharge voltage HVDD is supplied also to the bit lines BL and BLB connected with the shared sense amplifier 10. If Step S1' of the flowchart of FIG. 4 is added, both of the switch circuits 11a and 11b become conductive.

Figure 7A:
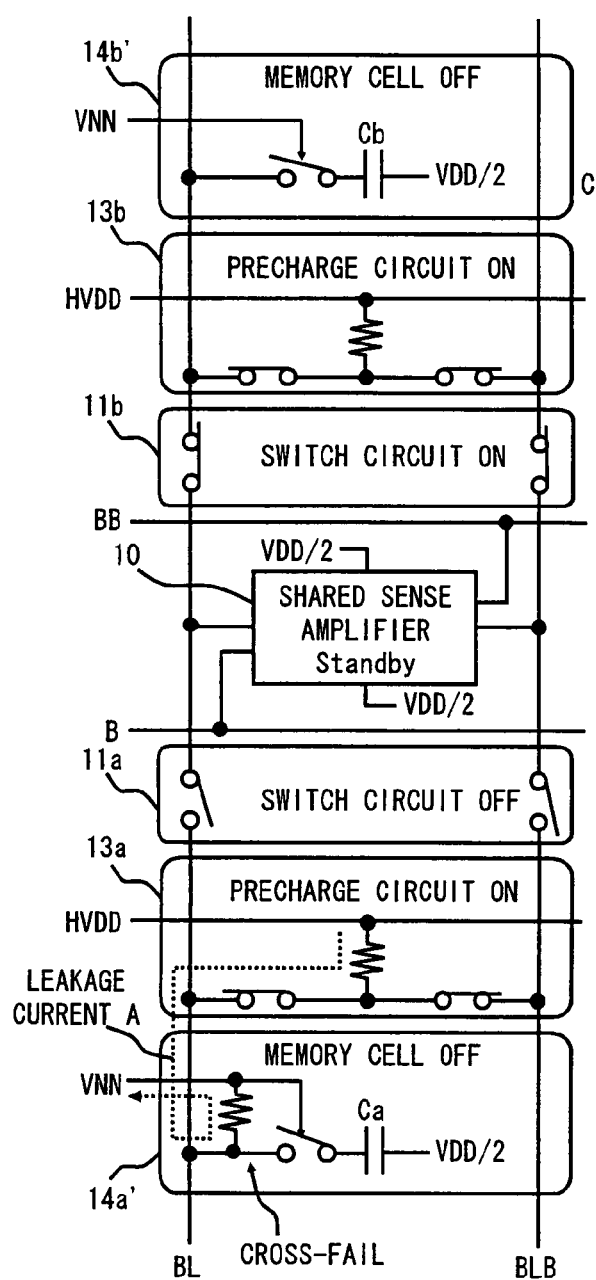
FIGS. 7A and 7B are schematic diagrams of a DRAM in the non-selection state where cross-fail occurs according to an embodiment of the present invention.

FIG. 7A is a schematic diagram showing the case where cross-fails occurs in the memory cell 14a'. As shown in FIG. 7A, the switch circuit 11a is OFF and the switch circuit 11b is ON in this case. The shared sense amplifier 10 receives VDD/2 at the power supply voltage and the ground voltage. The shared sense amplifier 10 is thereby in the non-selection state. The precharge circuits 13a and 13b are both in the ON state, so that the precharge voltage HVDD is supplied to the bit lines BL and BLB. Because the switch circuit 11b is ON, the precharge voltage HVDD is supplied to the bit lines BL and BLB connected with the shared sense amplifier 10 through the switch circuit 11b. The leakage current which flows through the cross-fail in the memory cell 14a' is only the leakage current A which flows from the precharge circuit 13a through the bit line BL and the cross-fail portion into the charge retention voltage VNN.

Figure 7B:
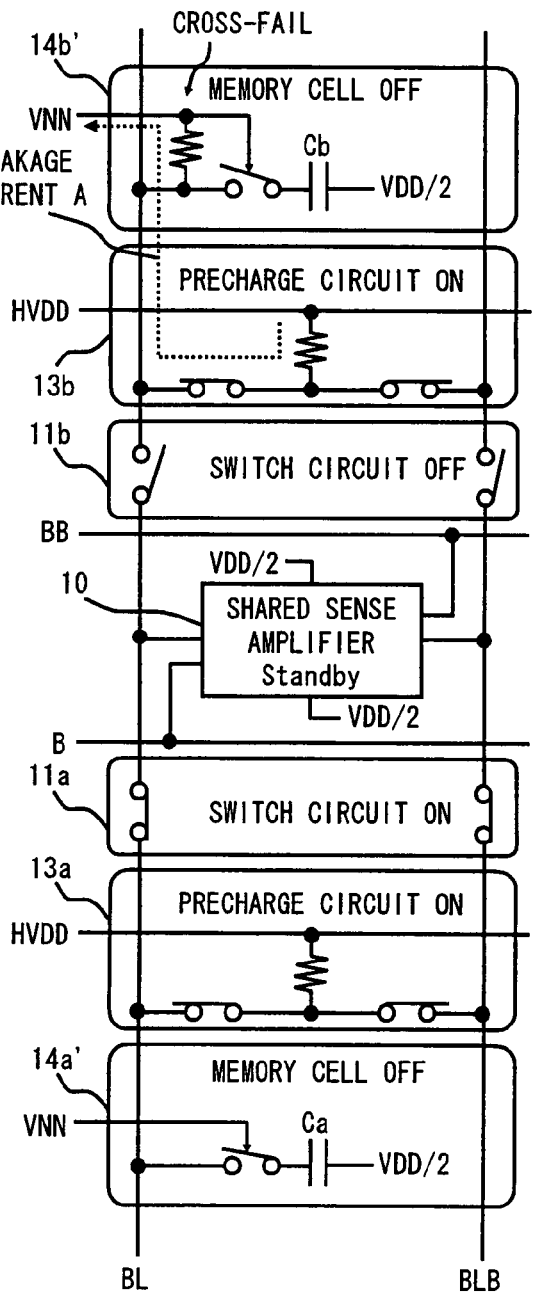

FIG. 7B is a schematic diagram showing the case where cross-fails occurs in the memory cell 14b' As shown in FIG. 7B, the switch circuit 11a is ON and the switch circuit 11b is OFF in this case. The shared sense amplifier 10 receives VDD/2 at the power supply voltage and the ground voltage. The shared sense amplifier 10 is thereby in the non-selection state. The precharge circuits 13a and 13b are both in the ON state, so that the precharge voltage HVDD is supplied to the bit lines BL and BLB. Because the switch circuit 11a is ON, the precharge voltage HVDD is supplied to the bit lines BL and BLB connected with the shared sense amplifier 10 through the switch circuit 11a. The leakage current which flows through the cross-fail in the memory cell 14b' is only the leakage current A which flows from the precharge circuit 13b through the bit line BL and the cross-fail portion into the charge retention voltage VNN.

FIG. 8 is a table showing the states of the switch circuits 11a and 11b in the selection state and the non-selection state. As shown in FIG. 8, in the DRAM 1 of this embodiment, the switch circuit 11a is ON and the switch circuit 11b is OFF when reading the memory cell 14a'. When reading the memory cell 14b', the switch circuit 11a is OFF and the switch circuit 11b is ON. If there is no cross-fail occurring in any memory cell in the non-selection state, either one of the switch circuits 11a and 11b is ON. If there is cross-fail occurring in the memory cell 14a' in the non-selection state, the switch circuit 11a is OFF and the switch circuit 11b is ON. If there is cross-fail occurring in the memory cell 14b' in the non-selection state, the switch circuit 11a is ON and the switch circuit 11b is OFF. Alternatively, if there is no cross-fail occurring in any memory cell in the non-selection state, both of the switch circuits 11a and 11b may be ON.

As described above, the DRAM 1 of this embodiment sets the switch circuit on the side of the memory cell where cross-fail occurs to the OFF state in the non-selection state according to the current inspection in the standby state which is carried out in advance. The leakage current which flows through the memory cell where cross-fail occurs is only the current flowing from the precharge circuit connected with the corresponding memory cell. Although the leakage current flows from the shared sense amplifier and the two precharge circuits connected with the shared sense amplifier in the related art, the leakage current flows only from one precharge circuit in this embodiment. Therefore, this embodiment enables reduction of the leakage current which flows through the memory cell in the non-selection state in the DRAM 1.

Further, because the state of the switch circuit in the non-selection state which is set according to the current inspection in the standby state which is carried out in advance is stored as nonvolatile data into the non-selection state storage section of the switch controller, the setting is not changed after the shipping.

Figure 9:
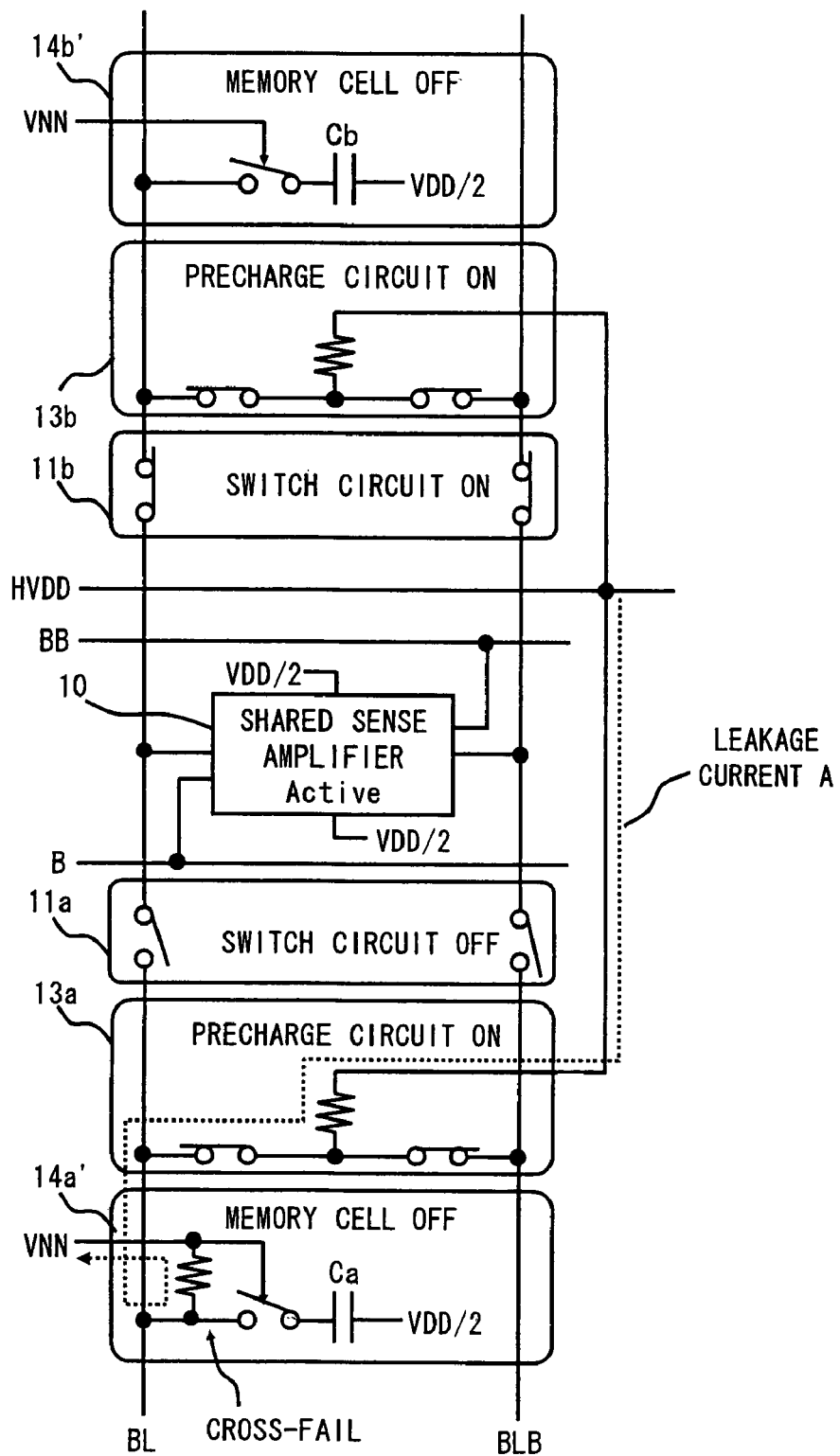
FIG. 9 is a schematic diagram of another example of a DRAM according to an embodiment of the present invention.

The way to connect the current limiter in the precharge circuit is not limited to the one described above. Examples where the current limiter in the precharge circuit is connected in a different way are described hereinafter. FIG. 9 shows one example. In the DRAM shown in FIG. 9, the precharge voltage HVDD is connected in common with the precharge circuits 13a and 13b, which respectively includes a current limiter independent of each other. In such a case, the precharge voltage HVDD and the power supply VDD/2 supplied to the shared sense amplifier 10 are at substantially the same level (e.g. VDD/2) and therefore leakage current does not flow from the shared sense amplifier 10. As a result, the example of FIG. 9 also enables the reduction of the leakage current in the DRAM compared the DRAM of the related art.

Figure 10:
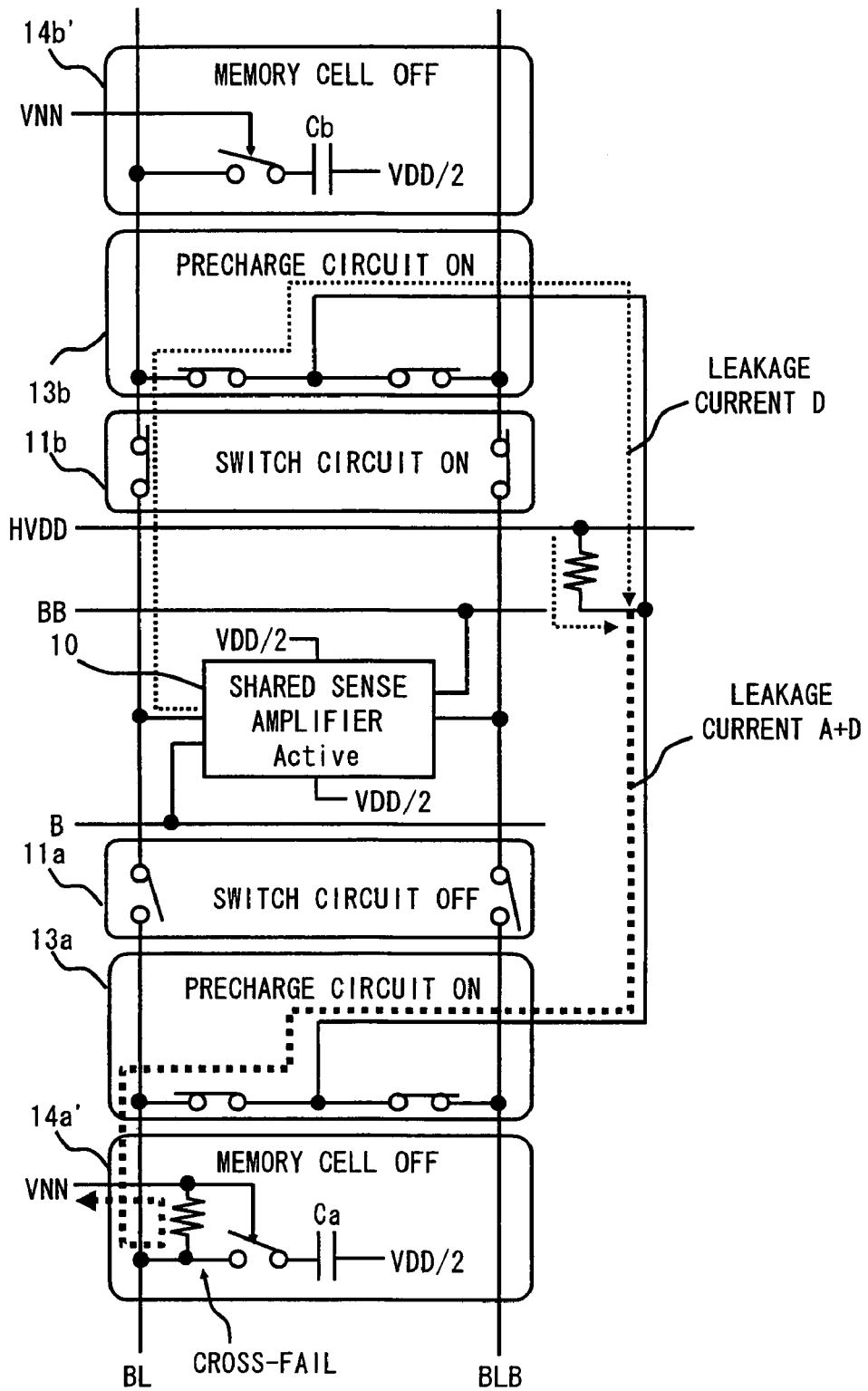
FIG. 10 is a schematic diagram of yet another example of a DRAM according to an embodiment of the present invention.

FIG. 10 shows another example. In the DRAM of FIG. 10, the precharge voltage HVDD is connected in common with the precharge circuits 13a and 13b, which includes a current limiter in common. In such a case, leakage current D which flows from the shared sense amplifier 10 through the switch circuit 11b and the precharge circuit 13b into the precharge circuit 13a flows in addition to the leakage current A shown in FIG. 7A. The source of the leakage current D is a power supply which is supplied to the shared sense amplifier 10, and the precharge circuit 13b exists in the path through which the leakage current D flows. Accordingly, the leakage current D is smaller than that when the switch circuit 11a is in the conducting state in the DRAM of the related art. As a result, the example of FIG. 10 also enables the reduction of the leakage current in the DRAM compared the DRAM of the related art.

The present invention is not limited to the above-described embodiment and may be altered appropriately without departing from the scope and spirit of the invention. For example, a storage section used as the non-selection state storage section is not limited to the one described in the above embodiment, and it may be a Zener-zap diode or the like which changes from the blocked state to the conducting state upon application of large current.

It is apparent that the present invention is not limited to the above embodiment that may be modified and changed without departing from the scope and spirit of the invention.

What is claimed is:

1. A semiconductor storage device comprising:
    a first and a second cell arrays including a plurality of memory cells to store data;
    a sense amplifier selectively connected with either one of the first and the second cell arrays;
    a first precharge circuit to set a pair of bit lines in the first cell array to a predetermined voltage;
    a second precharge circuit to set a pair of bit lines in the second cell array to a predetermined voltage;
    a first switch circuit to connect the sense amplifier with the first cell array;
    a second switch circuit to connect the sense amplifier with the second cell array; and
    a switch controller to control a conductive state of the first and the second switch circuits,
    wherein in a non-selection state where the sense amplifier does not access any of the first and the second cell arrays, the switch controller controls one of the first and the second switch circuits into the conductive state according to a previous result of a current inspection in a standby state,
    and wherein the switch controller includes a non-selection state storage section to store the conductive state of the first and the second switch circuits in the non-selection state according to a result of the current inspection in the standby state.

2. The semiconductor storage device according to claim 1, wherein
    if a current amount in the standby state is smaller than a predetermined value as a result of the current inspection in the standby state, the switch controller controls both of the first and the second switch circuits into the conductive state.

3. The semiconductor storage device according to claim 1, wherein
    the first and the second precharge circuits are connected with a first power supply through a current limiter.

4. The semiconductor storage device according to claim 1, wherein
    the first and the second precharge circuits respectively include a current limiter and are connected with a first power supply connected in common with the first and the second precharge circuits.

5. The semiconductor storage device according to claim 1, wherein
    the first and the second precharge circuits respectively include a current limiter and are connected with first power supplies connected respectively with the first and the second precharge circuits.

6. The semiconductor storage device according to claim 1, wherein
    the non-selection state storage section includes a fuse.

7. The semiconductor storage device according to claim 1, wherein
    the non-selection state storage section includes a nonvolatile memory.

8. A semiconductor storage device comprising:
    a first and a second cell arrays including a plurality of memory cells to store data;
    a sense amplifier selectively connected with either one of the first and the second cell arrays;
    a first precharge circuit to set a pair of bit lines in the first cell array to a predetermined voltage;
    a second precharge circuit to set a pair of bit lines in the second cell array to a predetermined voltage;
    a first switch circuit to connect the sense amplifier with the first cell array;
    a second switch circuit to connect the sense amplifier with the second cell array; and
    a switch controller to control a conductive state of the first and the second switch circuits, wherein in a non-selection state where the sense amplifier does not access any of the first and the second cell arrays, the switch controller controls one of the first and the second switch circuits into the conductive state according to a previous result of a current inspection in a standby state, and wherein the current inspection in the standby state measures a current amount in the standby state for each of the first and the second cell arrays, and the switch controller sets one of the first and the second switch circuits to connect the sense amplifier with one of the first and the second cell arrays having a larger current amount in the standby state into a blocked state in the non-selection state.

9. The semiconductor storage device according to claim 8, wherein if a current amount in the standby state is smaller than a predetermined value as a result of the current inspection in the standby state, the switch controller controls both of the first and the second switch circuits into the conductive state.

10. The semiconductor storage device according to claim 8, wherein the first and the second precharge circuits are connected with a first power supply through a current limiter.

11. The semiconductor storage device according to claim 8, wherein the first and the second precharge circuits respectively include a current limiter and are connected with a first power supply connected in common with the first and the second precharge circuits.

12. The semiconductor storage device according to claim 8, wherein the first and the second precharge circuits respectively include a current limiter and are connected with first power supplies connected respectively with the first and the second precharge circuits.

13. The semiconductor storage device according to claim 8, wherein the switch controller includes a non-selection state storage section to store the conductive state of the first and the second switch circuits in the non-selection state according to a result of the current inspection in the standby state, and the non-selection state storage section includes a fuse.

14. The semiconductor storage device according to claim 8, wherein the switch controller includes a non-selection state storage section to store the conductive state of the first and the second switch circuits in the non-selection state according to a result of the current inspection in the standby state, and the non-selection state storage section includes a nonvolatile memory.

15. A test method of a semiconductor storage device including a first switch circuit to connect a sense amplifier with a first cell array, a second switch circuit to connect the sense amplifier with a second cell array, a non-selection state storage section to store state of the first and the second switch circuits in non-selection state where the sense amplifier does not access any of the first and the second cell arrays, and a switch controller to control a conductive state of the first and the second switch circuits, the method comprising:

measuring a first standby current by setting the first switch circuit into a conducting state and the second switch circuit into a non-conducting state;

measuring a second standby current by setting the first switch circuit into the non-conducting state and the second switch circuit into the conducting state; and storing a switch circuit state where a smaller current amount of the first standby current or the second standby current is obtained into the non-selection state storage section, wherein the switch controller includes a non-selection state storage section to store the conducting state of the first and the second switch circuits in the non-selection state according to a result of a previous current inspection in a standby state.

16. The test method of the semiconductor storage device according to claim 15, further comprising:

measuring third standby current by setting the first and the second switch circuits into the conducting state, wherein if the third standby current is smaller than a predetermined current amount, the measurement of the first and the second standby current is not performed.

* * * * *